United States Patent [19]

Yoshii

[11] Patent Number: 4,804,941
[45] Date of Patent: Feb. 14, 1989

[54] CIRCUIT FOR COMPENSATING A LINEARITY OF AN INPUT/OUTPUT CHARACTERISTIC OF A PARALLEL COMPARISON TYPE ANALOG-TO-DIGITAL CONVERTER

[75] Inventor: Yoji Yoshii, Kanagawa, Japan

[73] Assignee: Sony Corporation, Tokyo, Japan

[21] Appl. No.: 153,356

[22] Filed: Feb. 8, 1988

[30] Foreign Application Priority Data

Feb. 12, 1987 [JP] Japan .................................. 62-030831

[51] Int. Cl.⁴ ........................ H03M 1/36; H03M 1/06
[52] U.S. Cl. ...................................... 341/140; 341/155
[58] Field of Search .................. 340/347 AD, 347 CC

[56] References Cited

U.S. PATENT DOCUMENTS

| | | | |
|---|---|---|---|
| 4,216,465 | 8/1980 | Huelsman | 340/347 AD |
| 4,496,935 | 1/1985 | Inoue | 340/347 CC |
| 4,578,715 | 3/1986 | Yamaguchi | 340/347 AD |

*Primary Examiner*—Charles D. Miller
*Attorney, Agent, or Firm*—Ronald P. Kananen

[57] ABSTRACT

An improved circuit for compensating an input/output characteristic linearity of a parallel comparison type analog-to-digital converter which reduces a wasteful consumption of current in the linearity compensation circuit. In the improved linearity compensation circuit, a dummy circuit having the same construction as a bias circuit of each comparator of the A/D converter is installed for providing a current $I_E$ which is an amplification of an input current by means of the input circuit of each comparator, a first current multiplier is installed for providing a multiplied current $kI_E$ on the basis of the current provided by the dummy circuit, an amplifier is installed for providing a current ki which corresponds to a multiplication of the current i by an amplification factor of the input circuit, and a second current multiplier is installed for providing another multiplied current kli which is a multiplication of the current ki by l. The other multiplied current kl is auxiliarily supplied to the input circuit. Therefore, the wastefully consumed current can be reduced to approximately $kI_E$.

28 Claims, 2 Drawing Sheets

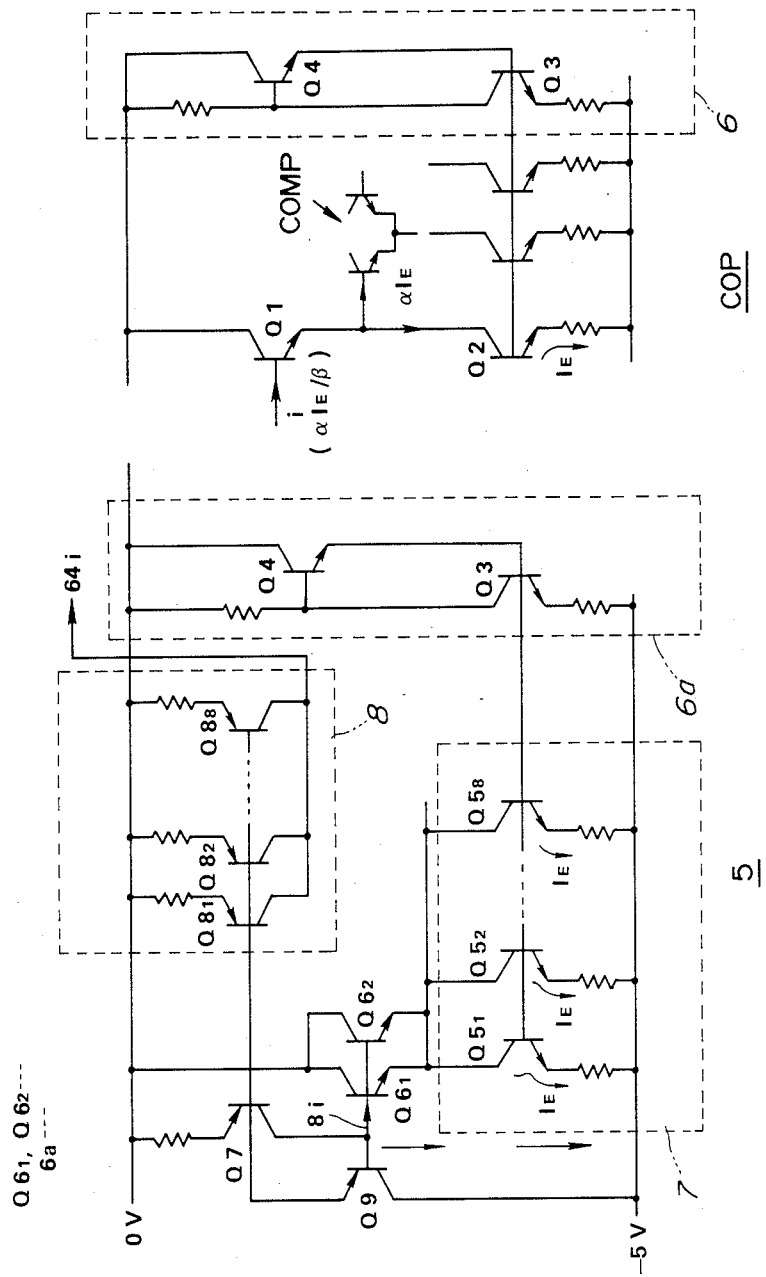

CIRCUIT FOR COMPENSATING A LINEARITY OF AN INPUT/OUTPUT CHARACTERISTIC OF A PARALLEL COMPARISON TYPE ANALOG-TO-DIGITAL CONVERTER

BACKGROUND OF THE INVENTION (1) Field of the Invention

The present invention relates to a circuit for compensating a linearity of an input/output characteristic of a parallel comparison type analog-to-digital converter (hereinafter simply referred to as an A/D converter).

(2) Background of the Art

In the above-described A/D converter, the input/output characteristic is often damaged due to a current flow through each comparator from a resistor chain for generating and outputting each comparison voltage to be compared with an input analog voltage.

Before explaining the linearity of the input/output characteristic in the A/D converter, a construction of the A/D converter will briefly be described.

An N-bit A/D converter generally includes parallel-connected comparators (a comparator group) having a number of $2^N-1$, series-connected resistors (a chain of resistors) having a number of $2^N$ and equal resistance values for dividing a reference voltage (for example, $-2$ V) into comparison reference voltages having a number of $2^N-1$ and whose voltage values are mutually and sequentially different. Each comparison voltage is supplied to the corresponding comparator and each comparator compares the corresponding comparison voltage with an input analog voltage $V_{IN}$ for determining one of the comparison voltages which is nearest to the input voltage $V_{IN}$. The converter includes an encoder for encoding the comparison result to derive an N-bit digital signal as the output of the A/D converter.

In addition, a linearity compensation circuit is provided for compensating the linearity of the input/output characteristic of the A/D converter affected due to a presence of a current flow to each comparator from the resistor chain for generating and outputting the comparison reference voltages. The resistor chain comprises the series-connected resistors.

In details, since all reference voltage dividing resistors in the resistor chain have mutually the same resistance values, terminal voltages across the respective resistors are mutually equal and a potential at a connection point between each resistor and its adjacent resistor becomes reduced by the same voltage value as the voltage is changed from the reference voltage supply side to a zero voltage side. Therefore, a characteristic curve representing a relationship between each resistor connecting point and a comparison voltage generated therefrom should have a perfect linearity.

However, since a constant current actually flows from the resistor chain to each comparator due to an input characteristic of each comparator, the current flowing through each resistor does not become even and the linearity of the comparison voltages will, therefore, be affected. This causes a worsened linearity of the above-described relationship input/output characteristic of the A/D converter and provides a source of errors in the output digital indication.

Consequently, it becomes necessary to compensate for the linearity by additionally supplying an auxiliary current to the conncecting point corresponding to an amount of the current which has flowed into the comparator group. The linearity compensating circuit serves as such a compensation as described above.

As the number of output terminals of the linearity compensation circuit connected to the resistor chain becomes increased, the compensation described above becomes more perfect.

If the number of output terminals from the compensation circuit is 255 which is one less than the number of resistors in the resistor chain of an 8-bit A/D converter for generating 256 comparison reference voltages and the amount of current by which each connecting point flows into the corresponding comparator is replenished so as to compensate for the current flowing through each corresponding comparator, a most perfect linearity will be achieved.

However, in this case, the construction of the whole linearity compensation circuit becomes complex and the construction of the A/D converter becomes accordingly large-sized. In addition, the power consumption of the whole A/D converter is increased.

One of improved linearity compensation circuits applied to the A/D converter has already been announced in a general national convention of Electronic and Communication Society of 1983 fiscal year (preliminary manuscripts, page 467) in Japan.

In the announced linearity compensation circuit, a section which determines a current of an ECL (Emitter-Coupled Logic) circuit used for the comparator group and encoder of the A/D converter is provided. In this section, a current flows into a main transistor thereof which is 384 times as great as the current denoted by i flowing into an input circuit of one comparator in the comparator group as an input current (base current). The magnitude of this current 384i is divided by six to derive six current flows 64i, 64i, 64i, 64i, 64i, and 64i by means of a current Miller circuit including four transistors. Then, three of the six currents (64i,64i, and 64i of the six-divided currents) are additionally supplied to three predetermined connecting points separated from one another by the number of the resistors of 64 in the resistor chain. It is noted that the currents which are 64 times as great as the above-described input current of each comparator are obtained by six and only three of these six currents are used for the linearity compensation. The remaining three currents are caused to flow wastefully through a minus terminal of the power supply of the linearity compensation circuit.

In this way, the previously announced linearity compensation circuit produces a current path through which a main current having a magnitude corresponding to a total current flow through all comparators in the A/D converter or corresponding to several times of the total current. In the above-described case, 384 represents 1½ times of the total current (256i)) flows. The main current is divided into a plurality of subcurrents by means of the current Miller circuit. Some of the subcurrents are supplied to appropriate connecting points respectively in the resistor chain of the A/D converter to compensate for the input currents flowing into the comparators.

However, the previously announced linearity compensation circuit has a drawback of increased current loss and consequent increased power consumption.

This is because the above-described main current (384i) flowing through the above-described main transistor of the above-described section is divided into six subcurrents by means of the other three transistors constituting the current Miller circuit and three subcurrents are supplied to the predetermined three connecting points of the resistor chain. Hence, if a current (the emitter current of a transistor) flowing through an input bias circuit of each of the comparators in response to an input current of the comparator is $I_E$, a total of 384 $I_E$ of current flows through the above-described transistors connected between the main transistor and minus terminal of the bias supply of the previously announced linearity compensation circuit. That is to say, to obtain three subcurrents 64i having the magnitude 64 times as great as the current i to be supplied to the input transistor of the comparator as the base current, the current 384 times as great as the emitter current $I_E$ of one transistor in the corresponding comparator must wastefully be caused to flow.

This causes remarkable increases in current flows through the linearity compensation circuit and in power loss in the A/D converter.

SUMMARY OF THE INVENTION

It is therefore an object of the present invention to provide an improved linearity compensation circuit for the A/D converter which can reduce a loss in current flow in the linearity compensation circuit and wasteful consumption of power in the A/D converter while maintaining accuracy and miniaturization of the A/D converter.

The above-described object can be achieved by providing a circuit for compensating an input/output characteristic linearity of an analog-to-digital converter, comprising: (a) first means for providing a first current having a magnitude corresponding to a second current which is an amplification of an input current flowing through an input circuit of one of a plurality of comparators in the analog-to-digital converter from a chain of resistors providing each of a plurality of comparison reference voltages for the corresponding one of the comparators; (b) second means for providing a third current on the basis of the first current, the third current being a multiplication of the second current by a first predetermined multiplication factor; (c) third means for providing a fourth current on the basis of the third current, the fourth current being a multiplication of the third current by an inverse of an amplification factor of the input circuit of the comparator; and (d) fourth means for providing a fifth current on the basis of the fourth current, the fifth current being a multiplication of the fourth current by a second predetermined multiplication factor and being supplied to the input circuit so as to compensate for a first input current flow totally supplied from a reference voltage supply of the resistor chain to a predetermined group of the input circuits of the comparators via the resistor chain.

The above-described object can also be achieved by a circuitry for compensating an input/output characteristic linearity of an 8-bit analog-to-digital converter, comprising: (a) three first circuits, each first circuit providing a first current having a magnitude corresponding to a second current $I_E$ which is an amplification of an input current i flowing through an input circuit of one of a plurality of comparators in the 8-bit analog-to-digital converter from a resistor chain providing each of a plurality of mutually different levels of comparison reference voltages for the corresponding one of the comparators; (b) three second circuits, each second circuit providing a third current $kI_E$ on the basis of the first current, the third current $kI_E$ being a multiplication of the second current $I_E$ by a first factor of a positive integer k; (c) three third circuits, each third circuit providing a fourth current ki on the basis of the third current $kI_E$, the fourth current being a multiplication of the third current $kI_E$ by an inverse of an emitter-grounded current amplification factor $\beta$ of the input circuit; and (d) three fourth circuits, each fourth circuit providing a fifth current kli on the basis of the fourth current, the fifth current being a multiplication of the fourth current ki by a second factor of a positive integer l and being supplied to a predetermined one of the comparators.

The above-described object can also be achieved by providing a circuit for compensating an input/output characteristic linearity of an analog-to-digital converter, comprising: (a) first circuit means for providing a first current having a magnitude substantially equal to a second current $I_E$ which is an amplification of an input current i flowing through an input circuit of one of a plurality of comparators of the analog-to-digital converter from a chain of resistors providing each of mutually different levels of comparison reference voltage for the corresponding one of the comparators; (b) second circuit means for providing a third current $kI_E$ on the basis of the first current, the third current $kI_E$ being a multiplication of the second current $I_E$ by a first multiplication factor k; (c) third circuit means for providing a fourth current ki on the basis of the third current $kI_E$, the fourth current ki being a multiplication of the third current by an inverse of an amplification factor of an input transistor in the input circuit for the corresponding comparison voltage of the input circuit; and (d) fourth circuit means for providing a fifth current kli on the basis of the fourth current ki, the fifth current being a multiplication of the fourth current ki by a second multiplication factor l and being supplied to a predetermined one of the comparators.

BRIEF DESCRIPTION OF THE DRAWINGS

FIG. 2 is a circuit construction of a linearity compensation circuit in a preferred embodiment according to the present invention which is applicable to the A/D converter shown in FIG. 1.

FIG. 3 is a circuit construction of an input circuit of one of the comparators in a comparator group shown in FIG. 1.

DETAILED DESCRIPTION OF THE PREFERRED EMBODIMENT

Figure 1:
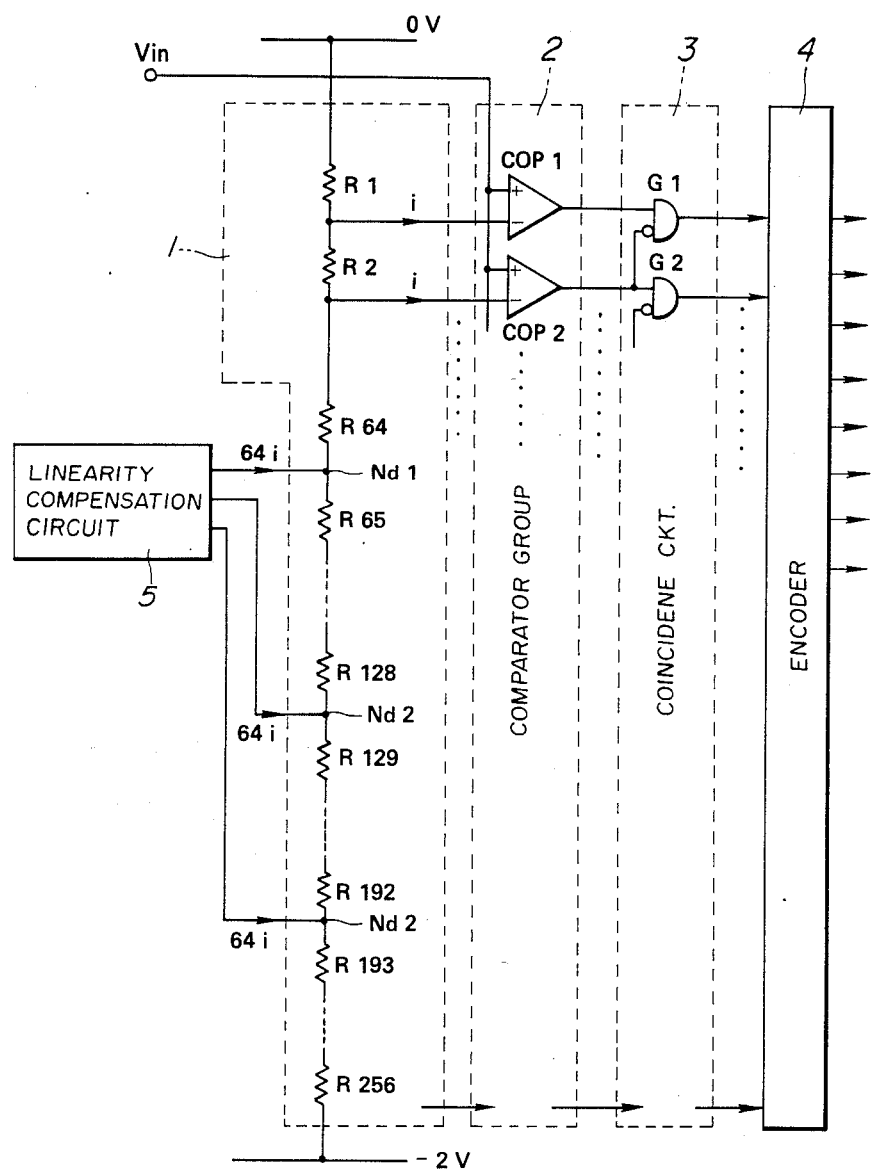
FIG. 1 is a whole circuit configuration of an A/D converter to which the present invention is applicable.

Reference will hereinafter be made to the drawings in order to facilitate understanding of the present invention.

FIG. 1 shows an 8-bit A/D converter to which the present invention is applicable.

In FIG. 1, a resistor chain 1 includes 256 resistors R1 to R256 which are serially connected to a reference voltage supply, for example, 2 volts. A first resistor is connected to a zero terminal and the 256th resistor is connected to a minus 2-volt terminal of the reference power supply. Each resistor connecting point in the resistor chain 1 provides a comparison reference voltage which has a different value from each of the other comparison reference voltages.

Each comparison reference voltage is inputted to a comparator group 2. The comparator group 2 includes 255 comparators COP1, COP2, - - - . Each comparator COP1 to COP255 receives one corresponding comparison voltage and compares it with an input voltage (i.e. an analog input signal) $V_{IN}$. An output signal of each comparator in the comparator group 2 is supplied to a coincidence detection circuit 3. The coincidence detection circuit 3 detects whether any one of the comparison voltages with which the input voltage $V_{IN}$ substantially coincides, i.e., to which one of the comparison reference voltages the input voltage $V_{IN}$ is nearest. The coincidence circuit 3 includes gates G1, G2, - - - for comparing the output signals between one comparator and an adjacent comparator, each output signal being transmitted to an encoder 4. Each gate G1, G2, - - - produces an output signals when the two input signal do not coincide with each other. When the input voltage $V_{IN}$ is applied to the A/D converter, the output signal from any one of the gates G is produced. When the output signal from any one of the gates G is produced, the digital signal (8 bits) is produced as the output signal of the A/D converter.

A linearity compensation circuit 5 is installed for compensating the linearity of an input/output characteristic of the A/D converter damaged by currents i, i, - - - flowing through the respective comparators COP from the resistor chain 1. The detailed construction and operation of the linearity compensation circuit 5 will be described later.

FIG. 2 shows a preferred embodiment of the linearity compensation circuit 5 shown in FIG. 1.

FIG. 3 shows an input circuit of one of the comparators COP in the comparator group 3 shown in FIG. 1.

In FIG. 2, a dummy bias circuit 6a is provided in the circuit 5 which has the same construction as a bias circuit 6 which determines a bias point at an input portion of each comparator COP shown in FIG. 3.

Next, in FIG. 3, an input circuit of the comparator COP includes an emitter follower transistor Q1 which receives one of 256 comparison reference voltages derived from the resistor chain 1 showin FIG. 1 at its base.

An emitter potential of the transistor Q1 is compared with the analog input voltage $V_{IN}$ by means of a comparison section denoted by COMP in FIG. 3 of the comparator COP. A transistor Q2 is connected to the emitter of the transistor Q1. The current flowing through the transistor Q2 is defined so as to have a predetermined value by means of the bias circuit 6. The bias circuit 6 includes transistors Q3 and Q4 and a resistor, as shown in FIG. 3. A predetermined current $I_E$ flows through the transistor Q3. The transistor Q3 constitutes a current Miller circuit together with the above-described transistor Q2 and so on (constant current flow transistors of the comparison section COMP).

Hence, the current $I_E$ having the same value as the current $I_E$ which flows through the transistor Q3 in the bias cuircuit 6 flows into the transistor Q2. It is noted that a compensation transistor Q4 is incorporated into the bias circuit 6 for increasing a current amplification factor since emitter-grounded current amplification factors of the transistors Q2 and Q3 constituting the current Miller circuit are insufficient due to the presence of base currents flowing through these transistors Q2 and which are non-negligibly large with respect to values of collector currents thereof.

If a base-grounded current amplification factor of the transistor Q2 is $\alpha$, the emitter current expressed as $\alpha I_E$ flows through the above-described transistor Q1 so that the current i expressed as $\alpha I_E/\beta$ flows into the transistor Q1 as its base current. It is noted that symbol $\beta$ denotes an emitter-grounded current amplification factor of, e.g., the transistor Q1. As described above, the current i is determined which flows from the resistor chain 1 shown in FIG. 1 to one comparator COP by means of the bias current 6.

The linearity compensation circuit 5 shown in FIG. 2 is provided with the dummy bias circuit 6a formed to have the exactly same construction as the bias circuit 6 for deriving the above-described current $I_E$.

In the linearity compensation circuit 5, as shown in FIG. 2, a first current multiplier 7 is installed which provides a current multiplication factor K (which is eight in the preferred embodiment). The current multiplier 7 includes eight parallel transistors $Q5_1$ to $Q5_8$ constituting one current Miller circuit together with the emitter follower transistor Q3 of the dummy circuit 6a through which the current $I_E$ of the above-described dummy bias circuit 6a flows as its emitter current, thus providing the total current flow expressed as $8I_E$ to the eight transistors $Q5_1$ to $Q5_8$. It is noted that each of the base-grounded current amplification factors $\alpha$ of the transistors $Q5_1$ to $Q5_8$ has the same value as that of the transistor Q2 and the current flowing through an interconnected collector of the current multiplier 7 is expressed as $8\alpha I_E$.

Transistors $Q6_1$ and $Q6_2$ constituted emitter follower transisstors with the current multiplier 7 being functioning as a load, thus functioning to provide the current of 8i at the bases of the transistors $Q6_1$ and $Q6_2$. Each of the emitter-grounded current amplification factors of the transistors $Q6_1$ and $Q6_2$ has the same value as that of the input transistor Q1 of the comparator COP shown in FIG. 3 and, hence, the total sum of the base currents of the transistors $Q6_1$ and $Q6_2$ is expressed as $8\alpha I_E/\beta$. This corresponds to the current expressed as 8i ($8i = 8\alpha I_E/\beta$).

In addition, a transistor Q7 is a transistor for supplying the base current to the transistors $Q6_1$ and $Q6_2$ and the current of 8i flows through the transistor Q7 as its collector current.

A second current multiplier 8 is installed in the linearity compensation circuit 5 shown in FIG. 2 which has the current multiplication factor l (8 in the preferred embodiment) for providing the current having the magnitude of 64i from the current of 8i. The second current multiplier 8 includes eight transistors $Q8_1$ to $Q8_8$, a total sum of the collector currents of the eight transistors $Q8_1$ to $Q8_8$ expressed as 64i being supplied to, e.g., a predetermined one of the connecting points between the resistors R64 and R65 in the resistor chain 1 denoted by Ndi shown in FIG. 1.

Furthermore, a transistor Q9 is installed in the linearity compensation circuit 5 which functions as the transistor Q4 in the dummy bias circuit 6a and bias circuit 6. The base current of the transistor Q9 is negligible as compared with the base current of 8i in each of the transistors $Q6_1$ and $Q6_2$.

It is noted that in the 8-bit A/D converter shown in FIG. 1, the three linearity compensation circuits 5 having the same constructions as shown in FIG. 2 are provided and the other two circuits are connected to the other two connecting points Nd2 and Nd3 for auxiliarily supplying the current flows to the corresponding comparators COPs.

As described above, the linearity compensation circuit 5 shown in FIG. 2 provides the same current as the emitter current $I_E(=\beta i/\alpha)$ flowing through the transistor Q2 of the input circuit of the comparator COP through the dummy bias circuit 6a formed so as to have the same construction as the bias circuit 6 of the input circuit in the one comparator COP. The current $I_E$ produced by the circuit 6a is multiplied by 8 by means of the first current multiplier 7 to provide the current of $8I_E$. After conversion of the current $8I_E$ into the base current of 8i ($8I_E/\beta$) by means of the transistors $Q6_1$ and $Q6_2$, the base current 8i is multiplied by 8 to provide the current 64i (64 times of the input current i) by means of a second current multiplier 8 constituted by the transistors $Q8_1$ to $Q8_8$ of the current Miller circuit together with the transistor Q7.

Therefore, according to the linearity compensation circuit described above, the current which must flow wastefully into the transistors $Q5_1$ to $Q5_8$ and Q3 of the dummy bias circuit 6a to obtain the same compansation current 64i amounts only to $9I_E$. Consequently, the value of the current ($9I_E + 9I_E + 9I_E = 27I_E$) is remarkably smaller than the current ($84I_E$) in the previously proposed linearity compensation circuit described in the Background of the Art.

In details, in the previously announced linearity compensation circuit, the total $384I_E$ current must be caused to flow into the transistors connected to the main transistor to obtain the three of the sub currents ($64i \times 3$). In addition, the current needed to provide the current of 64i amounts to $128I_E$. On the other hand, the linearity compensation circuit shown in FIG. 2 amounts to only $9I_E$ and, therefore, the wastefully consumed current can be reduced by about 1/15. It is noted that each emitter current of the transistor Q3 shown in FIGS. 2 and 3 needs not be made exactly equal to the emitter current $I_E$ of the transistor Q2. The dummy bias circuit 6a needs to have the same construction as the bias circuit 6. Then, the emitter load resistance of the transistor Q2 has the same value as that of each resistor of the emitter loads of the transistors $Q5_1$ to $Q5_8$. At this time, the emitter current of the transistor Q3 has substantially the same effect even if a value of the emitter current of the transistor Q3 is slightly less than the current $I_E$.

In addition, if the current amplification factor k of the first current multiplier 7 is varied, the wastefully consumed amount of current in the linearity compensation circuit can remarkably be reduced. For example, if the current multiplication factor k is 4, the current flowing through the current multiplication circuit 7 amounts to only $4I_E$ and the total wastefully consumed current amounts only to $5I_E$ with the current $I_E$ flowing through the dummy bias circuit 6a added.

However, in this case, it is necessary to change the current multiplication factor l of the second current multiplier 8 from 8 to 16. At this time, the number of the parallel transistors used in the second multiplifier 8 are slightly increased from 8 to 16.

Hence, preferably, with the degree of two demands to miniaturize the A/D converter to reduce current consumption taken into account, the current multiplication factors k and l of the two multipliers 7 and 8 need to be determined.

As an alternative, the number of the current multipliers 8 in the linearity compensation circuit 5 in the preferred embodiment may be three and the current of 64i may be outputted from each of the three current multipliers 8, 8, and 8. In doing so, the dummy bias circuit 6a, current multiplier 7, the transistors $Q6_1$, $Q6_2$, and Q7 can be commonized with the three current multipliers 8, 8, and 8 so that the total wastefully consumed current amounts only to $9I_E$ to obtain the sub currents of $3 \times 64i$.

As described hereinabove, in the linearity compensation circuit for the A/D converter according to the present invention, the current kli for the linearity compensation having the magnitude of the input current i of each comparator multiplied by kl by means of the plurality of current multipliers can be achieved and the current wastefully consumed for obtaining the current kli can amount only approximately to the current $kI_E$ consumed by means of the first current multiplier. Hence, the current required to achieve the same compensation current for the linearity of the input/output characteristic of the A/D converter can remarkably be reduced. In addition, the A/D converter can be small-sized and the power consumption thereof can accordingly be reduced with high accuracy maintained.

What is claimed is:

1. A circuit for compensating an input/output characteristic linearity of an analog-to-digital converter, comprising:
    (a) first means for providing a first current having a magnitude corresponding to a second current which is an amplification of an input current flowing through an input circuit of one of a plurality of comparators in the analog-to-digital converter from a chain of resistors providing each of a plurality of comparison reference voltages for the corresponding one of the comparators;
    (b) second means for providing a third current on the basis of the first current, the third current being a multiplication of a second current by a predetermined multiplication factor;
    (c) third means for providing a fourth current on the basis of the third current, the fourth current being a multiplication of the third current by an inverse of an amplification factor of the input circuit of the comparator; and
    (d) fourth means for providing a fifth current on the basis of the fourth current, the fifth current being a multiplication of the fourth current by a second predetermined multiplication factor and being supplied to the input circuit so as to compensate for a first input current flow totally supplied from a reference voltage supply of the resistor chain to a predetermined group of the input circuits of the comparators via the resistor chain.

2. A circuit as set forth in claim 1, wherein the first means supplies the fifth current to the input circuit of one of the other comparators so as to compensate for a second input current flow totally supplied from the reference voltage supply to a second predetermined group of the input circuits of the comparators subsequent to the predetermined group via the resistor chain and to the input circuit of another one of the other comparators so as to compensate for a third input current flow totally supplied from the reference voltage supply to a third group of input circuits of the comparators via the resistor chain subsequent to the second group.

3. A circuit as set forth in claim 1, wherein the first means comprises a plurality of first circuits, each first circuit being a dummy bias circuit having the same construction as a bias circuit of each comparator and providing the first current having the magnitude equal to the second current.

4. A circuit as set forth in claim 3, wherein the second means comprises a plurality of first current multipliers each of which multiplies the first current by the first multiplication factor.

5. A circuit as set forth in claim 4, wherein the first multiplication factor is a positive integer.

6. A circuit as set forth in claim 4, wherein the first predetermined multiplication factor has a different value from the second predetermined multiplication factor.

7. A circuit as set forth in claim 4, wherein the first predetermined factor has the same value as the second predetermined factor.

8. A circuit as set forth in claim 4, wherein each of the first current multipliers constitutes a first current Miller circuit together with a predetermined emitter follower transistor of the corresponding first circuit.

9. A circuit as set forth in claim 4, wherein the fourth means comprises a plurality of second current multipliers each of which multiplies the fourth current by the second multiplication factor.

10. A circuit as set forth in claim 9, wherein the second multiplication factor is a positive integer.

11. A circuit as set forth in claim 9, wherein the fourth means further includes a plurality of first emitter follower transistors and wherein each of the second current multipliers constitutes a second Miller circuit together with the corresponding one of the emitter follower transistors.

12. A circuit as set forth in claim 9, wherein each of the second Miller circuits comprises a plurality of parallel emitter follower transistors whose collectors are interconnected to provide the fifth current and whose bases are interconnected to another transistor for compensating an emitter-grounded current amplification factor of the first and second emitter follower transistors of the corresponding second current Miller circuit.

13. A circuit as set forth in claim 9, wherein the third means comprises a plurality of a set of first transistors each set of the first transistors connected between the corresponding first and second circuits and having an emitter grounded current amplification factor equal to that of an input transistor of the input circuit of the comparator.

14. A circuit as set forth in claim 13, wherein the numbers of the first circuits, first current multipliers, second current multipliers, the set of the first transistors are mutually the same and are determined on the basis of the number of bits of an output digital signal of the analog-to-digital converter.

15. A circuitry for compensating an input/output characteristic linearity of an 8-bit analog-to-digital converter, comprising:
 (a) three first circuits, each first circuit providing a first current having a magnitude corresponding to a second current $I_E$ which is an amplification of an input current i flowing through an input circuit of one of a plurality of comparators in the 8-bit analog-to-digital converter from a resistor chain providing each of a plurality of mutually different levels of comparison reference voltages for the corresponding one of the comparators;
 (b) three second circuits, each second circuit providing a third current $kI_E$ on the basis of the first current, the third current $kI_E$ being a multiplicater of the second current $I_E$ by a first factor of a positive integer k;
 (c) three third circuits, each third circuit providing a fourth current ki on the basis of the third current $kI_E$, the fourth current being a multiplication of the third current $kI_E$ by an inverse of an emitter-grounded current amplification factor $\beta$ of the input circuit; and
 (d) three fourth circuits, each fourth circuit providing a fifth current kli on the basis of the fourth current, the fifth current being a multiplication of the fourth current ki by a second factor of a positive integer l and being supplied to a predetermined one of 16. A circuitry as set forth in claim 15, wherein the first factor is 8 and the second factor is 8.

17. A circuitry as set forth in claim 16, wherein one of the three fifth currents 64i is supplied to the 64th comparator, one of the other two fifth currents 64i is suppied to the 128th comparator, and the remaining fifth current 64i is supplied to the 192nd comparator.

18. A circuitry as set forth in claim 15, wherein each of the first circuits has the same construction of a bias circuit of each comparator and includes a first emitter follower transistor and a resistor connected between the first transistor and a minus terminal of a power supply of the circuitry.

19. A circuitry as set forth in claim 18, wherein each of the second circuits comprises a first current multiplier having the first factor of multiplication and connected to the first transistor of the corresponding one of the first circuits.

20. A circuitry as set forth in claim 19, wherein the first current multiplier comprises a first current Miller circuit together with the first transistor of the first circuit, the first current Miller circuit having a plurality of parallel-connected second transistors whose bases are interconnected to the base of the first transistor and through each emitter of which the current equal to the first current $I_E$ flows via a resistor.

21. A circuitry as set forth in claim 20, wherein a value of the resistor connected between the emitter of the first transistor and a minus terminal of the power supply has the same value as each of the resistors connected between the emitter of each corresponding second transistor and the minus terminal.

22. A circuitry as set forth in claim 20, wherein each of the third circuits comprises two third transistors whose bases, emitters, and collectors are mutually connected and whose emitters are connected to the collectors of the second transistors of the first current Miller circuit so that the current expressed as $k\alpha I_E$ ($\alpha$ denotes a base-grounded current amplification factor) flows into the bases of the third transistors.

23. A circuitry as set forth in claim 22, wherein each of the fourth circuits comprises a second current multiplier having the second factor of multiplication and connected to the base of the third transistors via an emitter of a fourth transistor.

24. A circuitry as set forth in claim 23, wherein the first current multiplier has the first multiplication factor of 8 and the second current multiplier has the second multiplication factor of 8.

25. A circuitry as set forth in claim 23, wherein the first current multiplier has the first multiplication factor of 4 and the second current multiplier has the second multiplication factor of 16.

26. A circuitry as set forth in claim 23, wherein the second current multiplier comprises a plurality of parallel-connected fifth transistors whose bases are mutually connected and connected to the emitter of the fourth transistor, whose emitters are respectively connected to a zero terminal of the power supply via resistors, and whose collectors are interconnected to supply the fifth current to the predetermined one of the comparators, the plurality of parallel-connected fifth transistors constituting a second current Miller circuit together with a sixth transistor whose emitter is connected to the zero terminal of the power supply via a resistor, whose base is connected to the base of each fifth transistor, and whose collector is connected to the base of the fourth transistor.

27. A circuitry as set forth in claim 26, wherein the numbers of the second and fifth transistors are varied according to the first multiplication factor.

28. A circuit for compensating an input/output characteristic linearity of an analog-to-digital converter, comprising:

(a) first circuit means for providing a first current having a magnitude substantially equal to a second current $I_E$ which is an amplification of an input current i flowing through an input circuit for one of a plurality of comparators of the analog-to-digital converter from a chain of resistors providing each of mutually different levels of comparison reference voltage for the corresponding one of the comparators;

(b) second circuit means for providing a third current $kI_E$ on the basis of the first current, the third current $kI_E$ being a multiplication of the second current $I_E$ by a first multiplication factor k;

(c) third circuit means for providing a fourth current ki on the basis of the third current $kI_E$, the fourth current ki being a multiplication of the third current by an inverse of an amplification factor of an input transistor in the input circuit for the corresponding comparison voltage of the input circuit; and (d) fourth circuit means for providing a fifth current kli on the basis of the fourth current ki, the fifth current being a multiplication of the fourth current ki by a second multiplication factor l and being supplied to a predetermined one of the comparators.

* * * * *